United States Patent [19]
Barnett et al.

[11] Patent Number: 5,741,406
[45] Date of Patent: Apr. 21, 1998

[54] SOLID OXIDE FUEL CELLS HAVING DENSE YTTRIA-STABILIZED ZIRCONIA ELECTROLYTE FILMS AND METHOD OF DEPOSITING ELECTROLYTE FILMS

[75] Inventors: Scott Alexander Barnett, Evanston; Tsepin Tsai, Chicago, both of Ill.

[73] Assignee: Northwestern University, Evanston, Ill.

[21] Appl. No.: 630,725

[22] Filed: Apr. 2, 1996

[51] Int. Cl.$^6$ .................................................. C23C 14/00
[52] U.S. Cl. .................................... 204/192.15; 29/623.5; 427/115; 429/33
[58] Field of Search .......................... 429/30, 33, 192; 427/115; 204/192.15, 192.3, 192.22, 298.08; 29/623.5

[56] References Cited

U.S. PATENT DOCUMENTS

| | | | |
|---|---|---|---|
| 3,451,912 | 6/1969 | D'Heurle et al. | 204/192.15 X |
| 3,461,054 | 8/1969 | Vratny | 204/192.15 |
| 3,755,123 | 8/1973 | Davidse et al. | 204/192.15 |
| 4,040,929 | 8/1977 | Bauer et al. | 204/192.15 X |
| 4,937,152 | 6/1990 | Sato et al. | 429/30 |
| 4,963,239 | 10/1990 | Shimamura et al. | 204/192.3 X |
| 5,108,570 | 4/1992 | Wang | 204/192.3 |
| 5,395,704 | 3/1995 | Barnett et al. | 429/30 |
| 5,518,830 | 5/1996 | Worrell et al. | 429/31 |
| 5,534,489 | 7/1996 | Hayashi et al. | 427/126.3 X |

OTHER PUBLICATIONS

L.S. Wang and S.A. Barnett, *Solid State Ionics*, 61, 273 (1993), no month.
K. Nakagawa, H. Yoshioka, C. Kuroda, and M. Ishida, *ibid.*, 35, 249 (1989), no month.
T. Ishihara, T. Kudo, H. Matsuda, Y. Mizuhara, and Y. Takita, in *Proceedings of 3rd International Symposium on Solid Oxide Fuel Cells*, p. 65 (1993), no month.
N.Q. Minh, T.R. Armstrong, J.R. Esopa, J.V. Guiheen, C.R. Horne and J.J. Van Ackeren, *ibid.* p. 801 (1993), no month.
M. Suzuki, H. Sasaki, S. Otoshi, A. Kajimura, N. Sugiura, and M. Ippommatsu, *J. Electrochem. Soc.* 141, 1928 (1994), no month.
S.A. Barnett, *Energy*, 15, 1 (1990), no month.
E.S. Thiele, L.S. Wang, T.O. Mason and S.A. Barnett, *Vac. Sci. Technol.*, A9, 3054 (1991) (U.S. Patent No. 5,395,704), no month.
R.W. Knoll and E.R. Bradley, *Thin Solid Films*, 117, 201 (1984), no month.
B.J. Bartholomeusz and T.K. Katwar, *Thin Solid Films*, 181, 115 (1989), no month.
A.M. Haghiri, F.R. Ladan, C. Mayeux, and H. Launois, *Appl. Surf. Sci.*, 38, 295 (1989), no month.
D.M. Mattox and G.J. Kominiak, *J. Vac. Sci. Technol.*, 9, 528 (1971), no month.
I.W. Rangelow, *J. Vac. Sci. Technol.*, A1, 410 (1983), no month.
Y. Homma and S. Tsunekawa, *J. Electrochem. Soc.*, 132, 1466 (1985), no month.
H.P. Bader and M.A. Lardon, *J. Vac. Sci. Technol.*, A3, 2167 (1985), no month.
T. Tsai and S.A. Barnett, *J. Vac. Sci. Technol.*, in press, Jan. 1995.
X. Chu, S.A. Barnett, M.S. Wong, and W.D. Sproul, *Surf. & Coat. Technol.*, 57, 13 (1993), no month.

*Primary Examiner*—Anthony Skapars
*Attorney, Agent, or Firm*—Flehr Hohbach Test Albritton & Herbert LLP

[57] ABSTRACT

A method of forming a thin dense electrolyte for a SOFC is described.

4 Claims, 6 Drawing Sheets

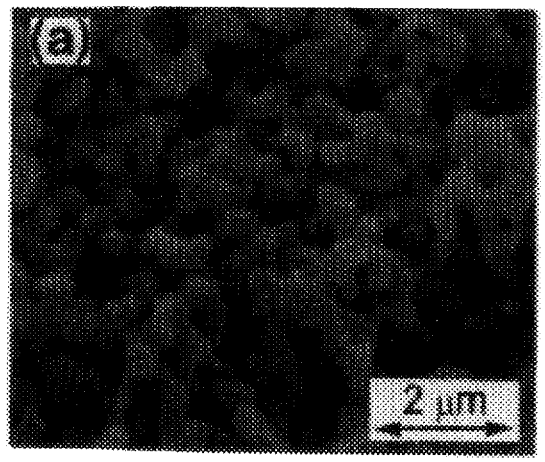
FIG.—5A
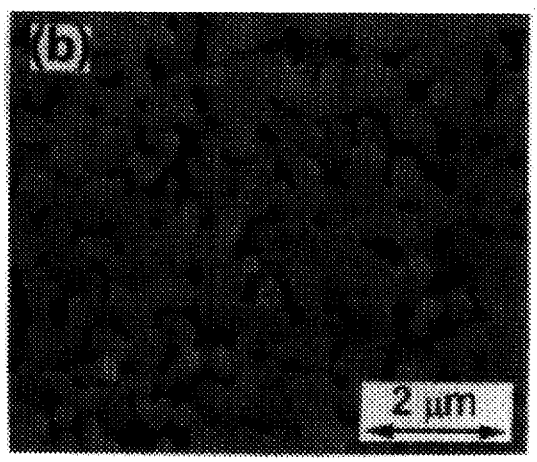
FIG.—5B
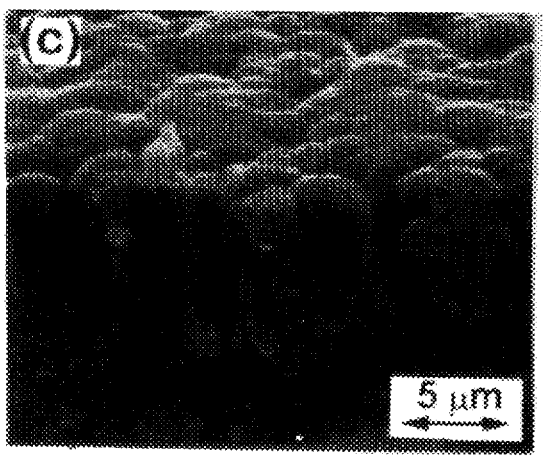
FIG.—5C
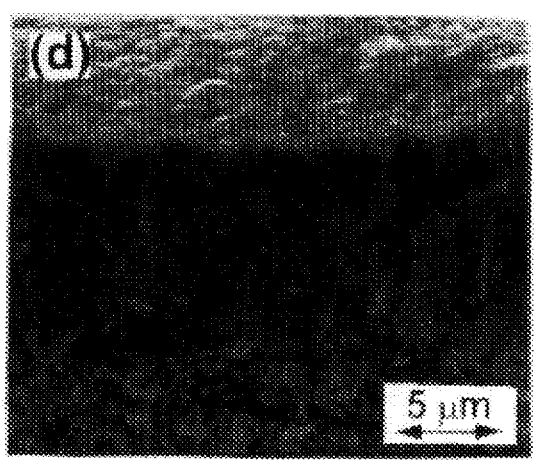
FIG.—5D

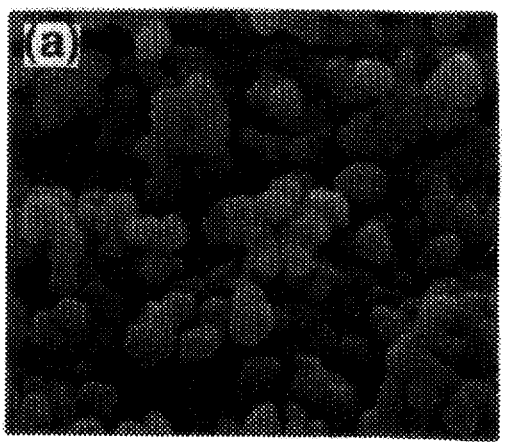
FIG.—7A
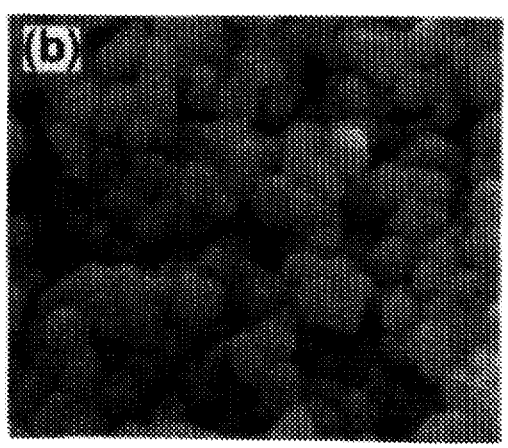
FIG.—7B
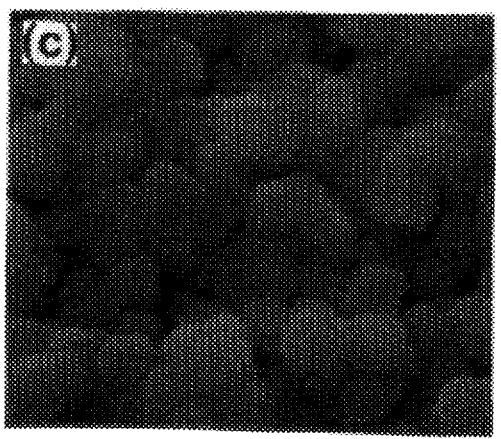
FIG.—7C
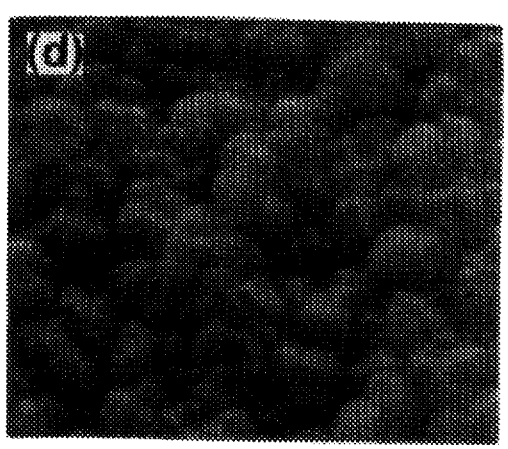
FIG.—7D 5,741,406

SOLID OXIDE FUEL CELLS HAVING DENSE YTTRIA-STABILIZED ZIRCONIA ELECTROLYTE FILMS AND METHOD OF DEPOSITING ELECTROLYTE FILMS

BRIEF SUMMARY OF THE INVENTION

The present invention relates to thin film solid oxide fuel cells having dense yttriastabilized zirconia (YSZ) films and to a method of sputter deposition of thin YSZ films.

BACKGROUND OF THE INVENTION

Several groups have recently reported results on solid oxide fuel cells (SOFC) employing thin (~10 μm) yttria-stabilized zirconia (YSZ) electrolytes. One of the main advantages of these thin-film-SOFC (TF-SOFC) is that electrolyte ohmic resistance is small enough for cell operation even at reduced temperatures $T_c$=600–800° C. Reduced $T_c$ should ease materials and processing problems associated with interconnection and gas sealing in SOFC stacks. The TF-SOFCs should presumably be fabricated at temperatures <$T_e$, both to minimize unwanted materials reactions and to maximize productivity in eventual SOFC manufacture.

Sputter deposition is the only technique that has been used thus far to fabricate TF-SOFCs at low temperatures (≈350° C.); other techniques involving a calendaring and electrochemical vapor deposition typically require temperatures >1300° C. However, TF-SOFCs with sputter-deposited electrolytes reported thus far have had open-circuit voltages (OCV) ≈75% of theoretical values despite relatively thick (12–20 μm) electrolytes. The low OCV was directly related to YSZ film porosity, which results from the substrate porosity and associated surface roughness. These sputter-deposited SOFCs would likely be impractical for real applications due to the low OCV values as well as the high cost associated with depositing the relatively thick electrolyte layers. Furthermore, the cells were deposited on insulating alumina substrates, impractical for most stacking geometries.

OBJECTS AND SUMMARY OF THE INVENTION

It is an object of the present invention to provide a method of fabricating dense yttria stabilized zirconia (YSZ) electrolyte films on lanthanum strontium manganite (LSM), LSM-YSZ, or other porous electrodes.

It is another object of the present invention to provide a method of fabricating thin film solid oxide fuel cells having a dense electrolyte.

It is a further object of the present invention to provide a method of sputter depositing a dense yttria-stabilized zirconia electrolyte film on a lanthanum strontium manganite substrate using ion-assisted deposition techniques such as sputtering.

The foregoing and other objects of the invention are achieved by sputter depositing a dense YSZ film on a LSM substrate which is biased to provide ion bombardment of the YSZ film as it is being deposited.

BRIEF DESCRIPTION OF THE DRAWINGS

FIGS. 5A–5B show SEM images of typical LSM surfaces prepared without (a) and with (b) a sieve step.

FIGS. 5C–5D show SEM fracture images of YSZ films deposited with $V_s$=0V on non-sieved and sieved LSM substrates respectively.

FIGS. 7A–7B show SEM images of YSZ films deposited on non-sieved LSM substrates for 10 min with $V_s$=0 V and 75 V respectively and for 30 min with $V_s$=0 V and 75 V(d) respectively.

FIGS. 7C–7D show SEM images of YSZ films deposited on non-sieved LSM substrates.

DESCRIPTION OF PREFERRED EMBODIMENT

Figure 1:
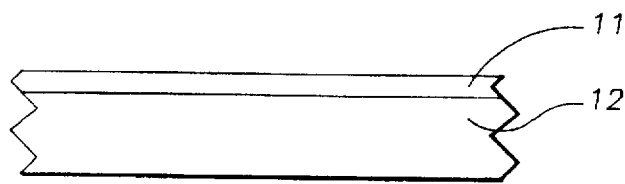
FIG. 1 is an enlarged cross sectional view of a substrate with a deposited electrolyte film.
Figure 2:
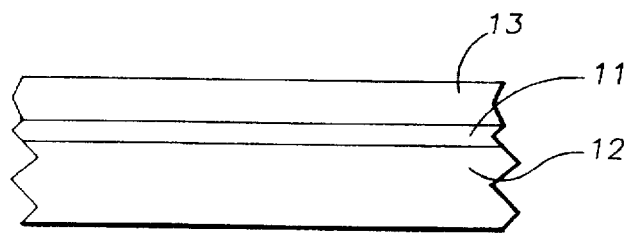
FIG. 2 is an enlarged cross sectional view of a portion of a solid oxide fuel cell employing an electrolyte film in accordance with the present invention.

FIG. 1 shows a thin dense yttria-stabilized zirconia (YSZ) dense film 11 deposited onto a porous lanthanum strontium reaganira, $La_{0.8}Sr_{0.2}MnO_3$ (ISM) substrate/electrode 12. FIG. 2 shows a thin film solid oxide fuel cell having LSM air electrode 12 on one side of a thin film YSZ electrolyte and a nickel yttria-stabilized zirconia NiYSZ fuel electrode 13 on the other side of the dense thin film YSZ electrolyte.

LSM substrate/air electrodes 12 were formed by mixing LSM powder (Seattle Specialty Ceramics) with 3 wt % binder and 1 wt % surfactant (Triton X-100, Aldrich) by ball milling. In some cases, the powder was then passed through a 200 mesh sieve (75 μm pore size) to remove large clumps of powder. The powder was then uniaxially pressed at 250 MPa to form 1.9 cm-diam, ≈1.5 mm thick pellets and fired in air, at 1200° C. for 3 hr for non-sieved pellets, or at 1150° C. for 1 hr for sieved pellets. FIGS. 5A and 5B show scanning electron microscope (SEM) images of typical 1SM surfaces prepared with and without the sieve step, respectively. In both cases, the porosity was 35%±5%, as measured by the Archimedes method, and the average pore size was ≈0.5 μm. The sieved substrates showed less surface roughness and were stronger. In the SEM results shown below, non-sieved substrates were used as examples since film structural changes were more readily observable. Sieved substrates were used for SOFC characterization due to their higher strength and smoother surfaces. All substrates were cleaned using acetone, methanol, and dichloroethane prior to inserting them into the sputter chamber for depositing the their dense YSZ film.

Figure 3:
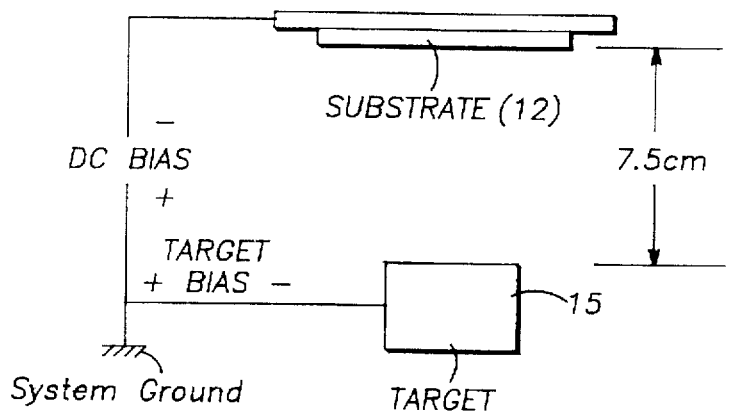
FIG. 3 is a schematic view of a portion of a sputter deposite ion system.
Figure 4:
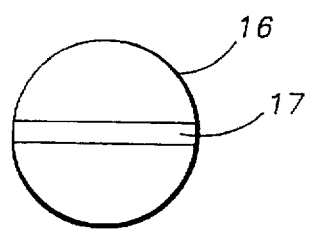
FIG. 4 is a schematic representation of the sputter source shown in FIG. 3.

$(Y_2O_3)_{0.1}(ZrO_2)_{0.9}$ films were deposited on substrate 12, FIG. 3 by DC reactive magnetron sputtering from a 5-cm-diameter Zr—Y (4.25:1 area ratio) composite target 15, with DC substrate bias. The composite Zr-Y sputtering target was made from a 3 mm thick, 5-cm-diam, 99.9% pure Zr disc 16. A strip 17 of 99.9% pure Y metal, 0.81 cm wide and 0.16 cm thick, was placed into a slot that was machined across the diameter of the Zr disc. The width of the Y strip was selected to give an area ratio of Y to Zr in the eroded portion of the target of 1:4.25. Alternatively, a $Zr_{1-x}Y_x$ alloy target with x ≈0.16–0.2 can be used. The deposition chamber was turbomolecular pumped and had typical base pressures of $\approx 10^{-6}$ Torr. The target plane of the single magnetron sputter source 15 was parallel to the substrate holder plane and separated by 7.5 cm. Deposition was carried out in $Ar/O_2$ mixtures with a 6 mTorr total pressure and an oxygen partial pressure of 0.2 mTorr, yielding stoichiometric YSZ films. Oxygen was inlet through a copper tube, placed 2 cm from the substrate surface plane but not blocking the sputtered flux, with perforations that directed the oxygen flow towards the substrate. This maximized oxidation of the depositing film while minimizing target oxidation. Ar was inlet remote from the deposition area. The deposition rate was $\approx 4$ μm/h at a target voltage of 400V and a current of 0.5A.

Substrates were mounted on a Ni substrate heater maintained at $\approx 450°$ C. during deposition, as measured by a thermocouple placed on the back side of the Ni substrate holder platen and by a pyrometer aimed directly at the substrate surface. Negative DC bias voltages $V_s$=0 to 300V, measured relative to system ground, were applied to the substrate during deposition.

It is common to use RF sputtering techniques for depositing YSZ films, both for sputtering YSZ targets and substrate biasing. The benefits of using DC sputtering of Zr—Y metal targets, namely the higher deposition rates for a given power level, have been described previously. DC substrate bias is simpler and less expensive than RF bias, and is effective for sufficiently high substrate temperatures. At 450° C., for example, the conductivity of YSZ is $1.6 \times 10^{-4}$ $(\Omega cm)^{-1}$, such that a 10 μm thick film has an area resistance of 6.25 $\Omega cm^2$. This is considerably less than the resistance of the glow discharge sheath, $\approx 10^4 \Omega cm^2$, such that substantial voltage drops across the film are not expected.

The substrate morphology had a pronounced effect on film structure. FIGS. 5C and 5D show fracture cross-section SEM images of ~7 μm thick YSZ films deposited with $V_s$=0V on the sieved and non-sieved substrates, respectively. The film on the nonsieved substrate (FIG. 5A) had a coarse columnar structure with clear porosity and a rough top surface. The film on the sieved substrate (FIG. 5B) is nearly featureless with no indication of porosity. This agrees with prior results where films sputter deposited onto rough surfaces often show considerable porosity.

Figure 6A:
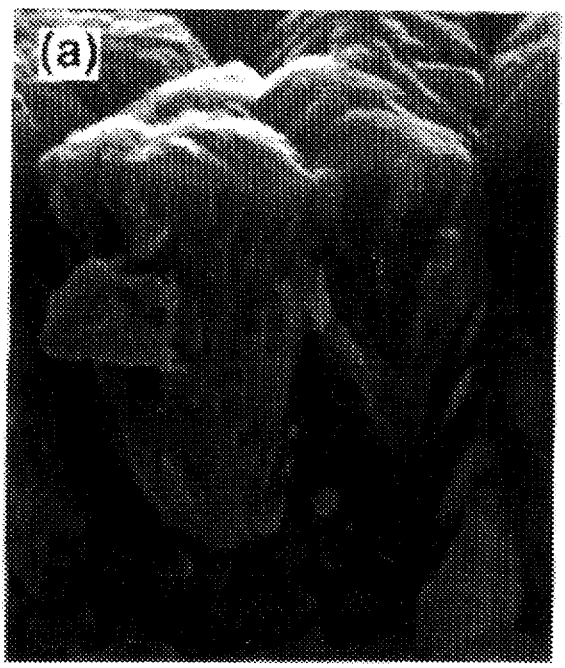
FIGS. 6A–6D show SEM fracture images of YSZ films deposited for 100 min on non-sieved LSM substrates with $V_s$=0 V, 75 V, 150 V, and 300 V respectively. The images show the fracture surface, both LSM and YSZ, along with the YSZ top surface.
Figure 6B:
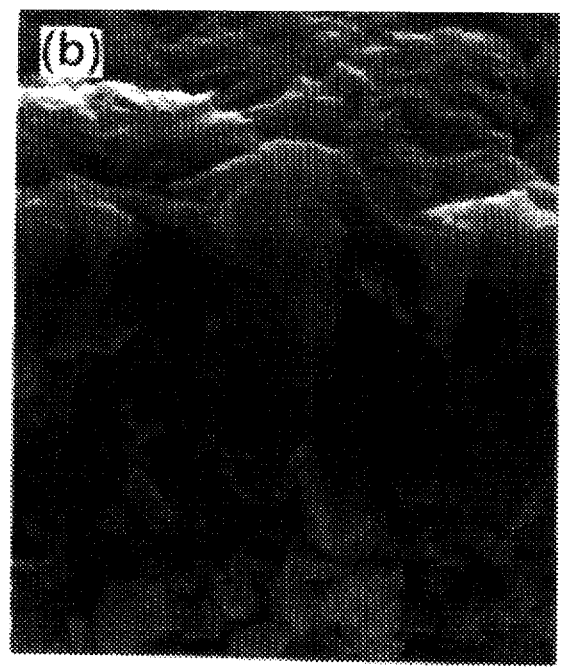
Figure 6C:
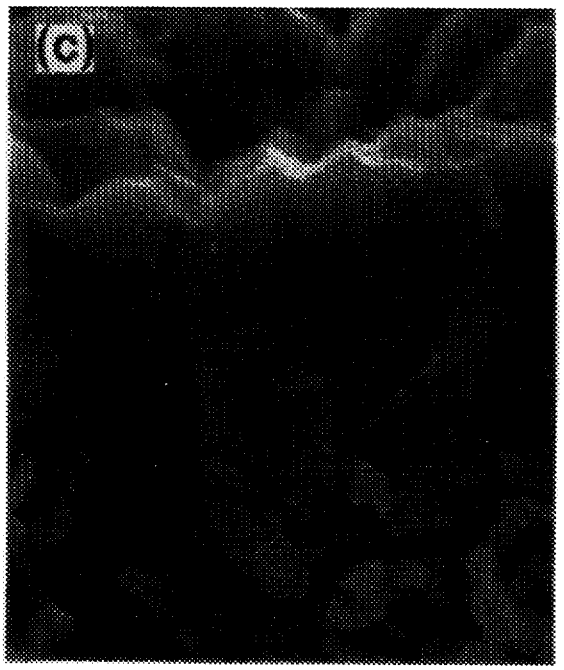
Figure 6D:
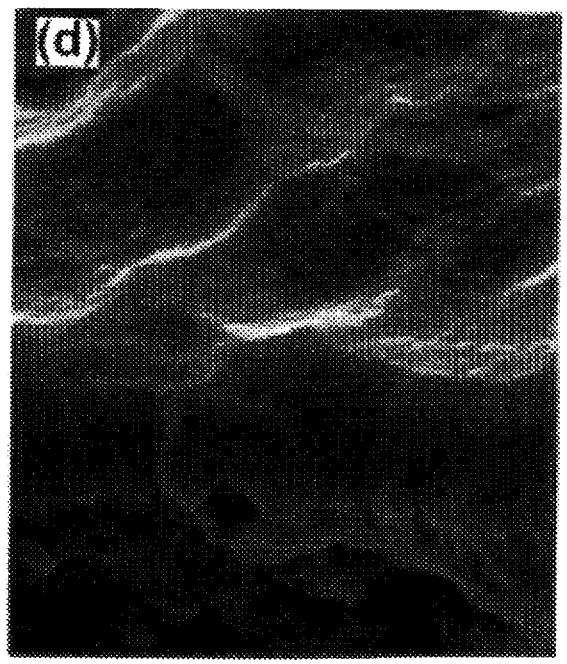

FIGS. 6A–6D show fracture cross-section SEM images of YSZ films as a function of the bias voltage, $V_s$, applied to the substrate. For $V_s$=0V (FIG. 6A), the structure was dominated by nodules with considerable porosity present. The structure changed from nodular to columnar with increasing $V_s$, with an apparently completely dense structure for $V_s$=150V (FIG. 6C) and 300V (FIG. 6D). The film thickness was clearly lower at $V_s$=300V, presumably a result of film re-sputtering. The film compressive stress increased with increasing $V_s$, as is often observed in bias sputtered films, and became large enough to cause either film delamination or substrate cracking for $V_s \geq 150V$ and films thicker than 3 μm. Thus, $V_s$=75V was used in depositing the films described below to provide some densification without too-large stress values.

To show the effect of bias on film formation, SEM images of $V_s$=0V and 75V films deposited to thicknesses of t=0.7 and 2 μm are shown in FIG. 7. The t=0.7 μm film grown with $V_s$=0V (FIG. 7A) shows a surface similar to the LSM substrate, with little coverage of pores. The same thickness with $V_s$=75V (FIG. 7B) showed better, although incomplete, coverage of the pores. For t=2 μm and $V_s$=0V (FIG. 7C) the surface structure was "cauliflower"-like, as often observed for porous sputtered films. Some pores in the film were still evident. For the same thickness and $V_s$=75V (FIG. 7D), however, the film top surface appeared completely dense. The surface was relatively flat except for some faceting, often observed with ion bombardment due to the ion-incidence-angle dependence of the sputtering yield.

The effect of substrate bias on film structure can be explained in terms of the ion-bombardment sputtering and re-deposition of film material. The mechanisms have been discussed previously for integrated circuit metallization applications. Without ion bombardment, the incoming sputtered flux deposits preferentially on high points, with relatively little deposition into pores. Since the temperature is too low for significant surface diffusion, this leads to nodule formation above high points and the continuation of pores into the film. With ion bombardment, some of the film material is re-sputtered, and at ion energies $eV_s \leq 300eV$ there is a strong preference for forward sputtering. This leads to preferential removal of material from protrusions, re-deposition into pores, and eventual film surface planarization.

SOFC tests were carried out to find the effect of $V_s$, and YSZ thickness on open-circuit voltage (OCV). The cells were fabricated by sputter depositing a Ni-YSZ fuel electrode from a Ni—Zr—Y alloy target in $Ar-O_2$ mixtures, as described in detail elsewhere, on the sputtered YSZ films. The cells were sealed to alumina tubes with high temperature cement and tested at 750° C. The theoretical OCV for the (air)LSM/YSZ/Ni-YSZ(97% $H_2$+3% $H_2O$) cells was $\approx 1.1V$. Maximum cell power densities were $\approx 300$ mW/cm$^2$ under these conditions, and variations in the gas compositions indicated that the primary contribution to cell resistance was the LSM/YSZ interface.

Figure 8:
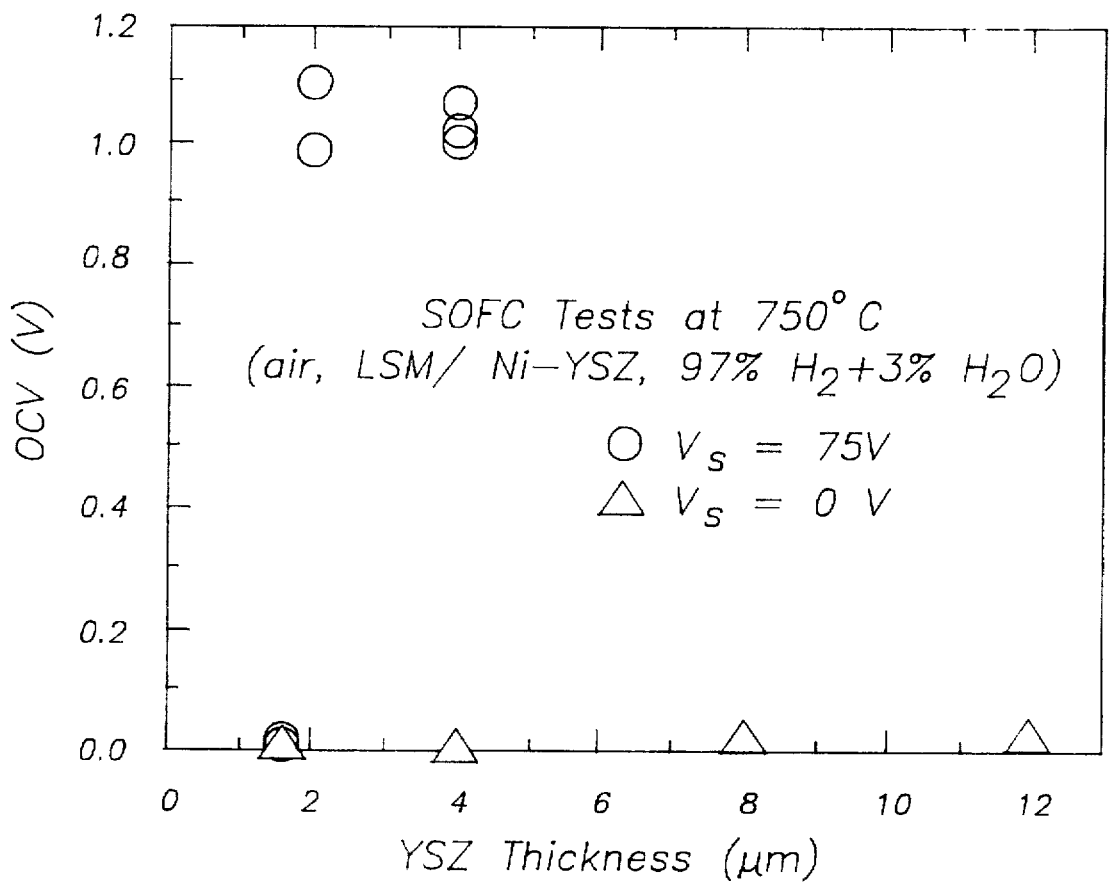
FIG. 8 shows dependence of open-circuit voltage on the YSZ film thickness for $V_s$=0 and 75V. The YSZ films were deposited on sieved LSM substrates.

The measured OCV values are shown as a function of YSZ thickness in FIG. 8. OCV values were near theoretical for $V_s$=75V and t≥2 μm, but very low for $V_s$=0V at all t values. These results correlate well with the improved YSZ structure at $V_s$=75V shown in FIGS. 5 and 6. The low OCV values probably resulted from short circuiting across the YSZ layers, i.e. the Ni-YSZ electrode contacting the LSM electrode through pores in the YSZ. In the case of thicker YSZ films, the shorts likely occurred at large pores resulting from a few substrate surface flaws. Additional evidence of a short-circuiting mechanism was found in cell test results at low hydrogen partial pressure, e.g. a fuel mixture of 3% $H_2$:3% $H_2O$: balance Ar. Under these conditions, all the cells shown in FIG. 8 gave OCV values close to the theoretical value of 0.96V. This may indicate that oxygen leaking across holes in the YSZ to the fuel side oxidized the Ni in contact with LSM, eliminating the short circuits.

The above results show that substrate bias has a substantial effect on the quality of YSZ electrolytes. Sputtered TF-SOFCs with essentially theoretical OCV values are obtained. The present electrolyte thicknesses were as low as 2 μm, much less than prior 12–20 μm thick sputtered cell electrolytes. Unbalanced magnetron sputter sources provide higher substrate ion bombardment fluxes for a given $V_s$ value, this will allow more rapid densification without significant increases in film compressive stress. It may also be possible to deposit thinner dense films by using higher $V_s$ values, since the compressive stress effect will be less important in thinner layers.

What is claimed:

1. The method of fabricating a thin film solid oxide fuel cell which comprises the steps of forming a LSM substrate/air electrode, placing a Zr—Y sputter target in a sputter deposition chamber, placing the LSM substrate/air electrode in said sputter deposition chamber spaced from said sputter target, applying a negative DC bias voltage between 75 and 150 volts to said substrate, sputtering material from said target onto said substrate/air electrode while the negative bias voltage is applied to said substrate to deposit a thin dense YSZ film on the substrate, and sputtering a thin fuel electrode film on the surface of the YSZ film.

2. The method of fabricating a thin film solid oxide fuel cell as in claim 1 in which the bias voltage and the film deposition time are selected to deposit a film having a thickness greater than 2 µm.

3. The method of fabricating a thin film solid oxide fuel cell as in claim 1 in which the bias voltage and the film deposition time are selected to deposit a film having a thickness greater than 2 µm but less than 20 µm.

4. The method of fabricating a thin film solid oxide fuel cell as in claim 1 in which the fuel electrodes is formed by placing a Ni—Zr—Y alloy target in a deposition chamber, and sputtering material from said Ni—Zr—Y alloy target onto the surface of said dense YSZ film to form a thin fuel electrode film.

* * * * *